(12) United States Patent
Edmond et al.

(10) Patent No.: US 6,987,281 B2
(45) Date of Patent: Jan. 17, 2006

(54) GROUP III NITRIDE CONTACT STRUCTURES FOR LIGHT EMITTING DEVICES

(75) Inventors: John Adam Edmond, Cary, NC (US); Kathleen Marie Doverspike, Apex, NC (US); Michael John Bergmann, Durham, NC (US); Hua-Shuang Kong, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/366,053

(22) Filed: Feb. 13, 2003

(65) Prior Publication Data

US 2004/0159851 A1 Aug. 19, 2004

(51) Int. Cl.
*H01L 33/00* (2006.01)

(52) U.S. Cl. ............................. 257/15; 257/21; 257/79; 257/99; 257/103

(58) Field of Classification Search .................. 257/12, 257/13, 15, 21, 79, 94, 99, 103
See application file for complete search history.

(56) References Cited

U.S. PATENT DOCUMENTS

| | | |
|---|---|---|
| 4,865,685 A | 9/1989 | Palmour |
| 4,866,005 A | 9/1989 | Davis et al. |
| 4,912,063 A | 3/1990 | Davis et al. |
| 4,912,064 A | 3/1990 | Kong et al. |
| 4,918,497 A | 4/1990 | Edmond |
| 4,946,547 A | 8/1990 | Palmour et al. |
| 4,981,551 A | 1/1991 | Palmour |
| 5,011,549 A | 4/1991 | Kong et al. |
| 5,027,168 A | 6/1991 | Edmond |
| 5,087,576 A | 2/1992 | Edmond et al. |
| 5,119,540 A | 6/1992 | Kong et al. |
| 5,338,944 A | 8/1994 | Edmond et al. |
| 5,753,939 A * | 5/1998 | Sassa et al. .................... 257/94 |
| 5,812,576 A * | 9/1998 | Bour ............................ 372/45 |
| 6,051,849 A | 4/2000 | Davis et al. |
| 6,063,186 A | 5/2000 | Irvine et al. |
| 6,117,688 A | 9/2000 | Evans, Jr. et al. |
| 6,153,010 A * | 11/2000 | Kiyoku et al. ................. 117/95 |
| 6,265,289 B1 | 7/2001 | Zheleva et al. |
| 6,459,100 B1 | 10/2002 | Doverspike et al. |
| 6,479,836 B1 * | 11/2002 | Suzuki et al. .................. 257/15 |
| 6,582,986 B2 | 6/2003 | Kong et al. |
| 6,608,327 B1 | 8/2003 | Davis et al. |
| 2002/0008243 A1 | 1/2002 | Scott et al. |
| 2002/0141468 A1 | 3/2002 | Shigetoshi et al |

FOREIGN PATENT DOCUMENTS

| | | |
|---|---|---|
| EP | 0 622 858 A2 | 11/1994 |
| WO | WO 03/005459 | 1/2003 |

OTHER PUBLICATIONS

Jeon et al.; Lateral current spreading in GaN–based light–emitting diodes utilizing tunnel contact junctions; Applied Physics Letters, vol. 78, No. 21; May 21, 2001; pp. 3265–3267; American Institute of Physics.

Sheu et al.; Low–Operation Voltage of InGaN/GaN Light–Emitting Diodes with Si–Doped In(0.3) Ga(0.7) N/GaN Short–Period Superlattice Tunneling Contact Layer; IEEE Electron Device Letters; vol. 22, No. 10; Oct. 2001.

(Continued)

*Primary Examiner*—Minhloan Tran
*Assistant Examiner*—Thomas L Dickey
(74) *Attorney, Agent, or Firm*—Summa & Allan, P.A.

(57) ABSTRACT

A superlattice contact structure for light emitting devices includes a plurality of contiguous p-type Group III nitride layers. The contact structure may be formed of p-type indium nitride, aluminum indium nitride, or indium gallium nitride. Also disclosed is a light emitting device that incorporates the disclosed contact structures.

13 Claims, 3 Drawing Sheets

OTHER PUBLICATIONS

Sheu J K et al; Low–operation voltage of INGAN/GAN Light–Emitting Diodes by Using a MG–DOPED AlO.15GaO.85N/GANSuperlattice;Apr. 4, 2001; 160–162; V22/10;XP–001099979.

Sheu J K et al; Low–operation voltage of INGAN/GAN Light–Emitting Diodes With SI–DOPED INO.3GAO.7N/GAN Short–Period Superlattic Tunneling Contact Layer; IEEE Electron Device Letters, IEEE Inc.; New York, US; V22/10; 10–10–2001; pp. 460–462; XP001108397.

Myers T H et al.; Magnesium and Beryllium Doping During ri–plasma MBE Growth of GanN; Sep. 24, 2000; Proceedings of International Workshop on Nitride Semiconductors Inst. Pure & Appl. Phys. Tokyo, Japan; pp. 451–454; XP002302522.

* cited by examiner

| |
|---|
| 15b—p-type Group III nitride layer |
| 15a—p-type Group III nitride layer |
| 15b—p-type Group III nitride layer |
| 15a—p-type Group III nitride layer |
| 15b—p-type Group III nitride layer |
| 15a—p-type Group III nitride layer |
| 15b—p-type Group III nitride layer |
| 15a—p-type Group III nitride layer |
| 15b—p-type Group III nitride layer |
| 15a—p-type Group III nitride layer |

· · ·

GROUP III NITRIDE CONTACT STRUCTURES FOR LIGHT EMITTING DEVICES

RELATED APPLICATIONS

This application incorporates entirely by reference the following co-pending and commonly-assigned applications: Ser. No. 09/706,057 (Group III Nitride Light Emitting Devices with Gallium-Free Layers), filed on Nov. 3, 2000 and issued as U.S. Pat. No. 6,534,797; Ser. No. 09/760,635 (Group III Nitride LED with Undoped Active Layer and Undoped Cladding Layer), filed on Jan. 16, 2001); and Ser. No. 10/365,901 (Group III Nitride LED with Silicon Carbide Cladding Layer, filed on Feb. 13, 2003). This application claims priority, pursuant to 37 C.F.R. 1.78, to Ser. No. 10/376,494 (Light Emitting Devices with Group III Nitride Contact Layer and Superlattice), filed on Mar. 1, 2003 with a priority date of Nov. 3, 2000. This application also claims priority to Ser. No. 09/760,635, filed on Jan. 16, 2001.

FIELD OF THE INVENTION

The present invention relates to Group III nitride contact structures that can be included in light emitting devices, particularly light emitting diodes and laser diodes formed from Group III nitrides, which are capable of emitting light in the red to ultraviolet portions of the electromagnetic spectrum.

BACKGROUND OF THE INVENTION

Photonic semiconductor devices fall into three categories: devices that convert electrical energy into optical radiation (e.g., light emitting diodes and laser diodes); devices that detect optical signals (e.g., photodetectors); and devices that convert optical radiation into electrical energy (e.g., photovoltaic devices and solar cells). Although all three kinds of devices have useful applications, the light emitting diode may be the most commonly recognized because of its application to various consumer products and applications.

Light emitting devices (e.g., light emitting diodes and laser diodes), herein referred to as LEDs, are photonic, p-n junction semiconductor devices that convert electrical power into emitted light. Perhaps most commonly, LEDs form the light source in the visible portion of the electromagnetic spectrum for various signals, indicators, gauges, and displays used in many consumer products (e.g., audio systems, automobiles, household electronics, and computer systems). LEDs are desirable as light output devices because of their generally long lifetime, their low power requirements, and their high reliability.

Those of ordinary skill in this art will recognize that the abbreviation "LED" is also often used to describe the more specific category of light-emitting diodes. As used herein, the particular meaning will generally clear from the context.

Despite widespread use, LEDs are somewhat functionally constrained, because the color that a given LED can produce is limited by the nature of the semiconductor material used to fabricate the LED. As well known to those of ordinary skill in this and related arts, the process by which light is generated in an LED is referred to as "electroluminescence," which refers to the generation of light by passing an electric current through a material under an applied voltage. Any particular composition that produces electroluminescent light tends to do so over a relatively narrow range of wavelengths.

The wavelength of light (i.e., the color) that can be emitted by a given LED material is limited by the physical characteristics of that material, specifically its bandgap energy. Bandgap energy is the amount of energy that separates a lower-energy valence band and a higher energy conduction band in a semiconductor. The bands are energy states in which carriers (i.e., electrons or holes) can reside in accordance with well-known principles of quantum mechanics. The "bandgap" is a range of energy between the conduction and valence bands that are forbidden to the carriers (i.e., the carriers cannot exist in these energy states). Under certain circumstances, when an electron from the conduction band crosses the bandgap and recombines with a hole in the valence band, a quantum of energy is released in the form of light. The frequency of the emitted light is proportional to the energy released during the recombination. In other words, the frequency of electromagnetic radiation (i.e., the color) that can be produced by a given semiconductor material is a function of the material's bandgap energy.

In this regard, narrower bandgaps produce lower energy, longer wavelength photons. Conversely, wider bandgap materials produce higher energy, shorter wavelength photons. Blue light has a shorter wavelength—and thus a higher frequency—than the other colors in the visible spectrum. Consequently, blue light must be produced from transitions that are greater in energy than those transitions that produce green, yellow, orange, or red light. Producing photons that have wavelengths in the blue or ultraviolet portions of the electromagnetic spectrum requires semiconductor materials that have relatively large bandgaps.

The entire visible spectrum runs from the violet at or about 390 nanometers to the red at about 780 nanometers. In turn, the blue portion of the visible spectrum can be considered to extend between the wavelengths of about 425 and 480 nanometers. The wavelengths of about 425 nanometers (near violet) and 480 nanometers (near green) in turn represent energy transitions of about 2.9 eV and about 2.6 eV, respectively. Accordingly, only a material with a bandgap of at least about 2.6 eV can produce blue light.

Shorter wavelength devices offer a number of advantages in addition to color. In particular, when used in optical storage and memory devices, such as CD-ROM optical disks, shorter wavelengths enable such storage devices to hold significantly more information. For example, an optical device storing information using blue light can hold substantially more information in the same space as one using red light.

The basic mechanisms by which light-emitting diodes operate are well understood in this art and are set forth, for example, by Sze, Physics of Semiconductor Devices, 2d Edition (1981) at pages 681–703.

The common assignee of the present patent application was the first in this field to successfully develop commercially viable LEDs that emitted light in the blue color spectrum and that were available in commercial quantities. These LEDs were formed in silicon carbide, a wide-bandgap semiconductor material. Examples of such blue LEDs are described in U.S. Pat. Nos. 4,918,497 and 5,027,168 to Edmond each titled "Blue Light Emitting Diode Formed in Silicon Carbide."

In addition to silicon carbide, candidate materials for blue light emitting devices are gallium nitride (GaN) and its associated Group III (i.e., Group III of the periodic table) nitride compounds such as aluminum gallium nitride (AlGaN), indium gallium nitride (InGaN), and in some circumstances aluminum indium gallium nitride (AlInGaN). These materials are particularly attractive because they offer direct energy transitions with bandgaps between about 1.9 to about 6.2 eV at room temperature. More common semiconductor materials such as silicon, gallium phosphide, or gallium arsenide are unsuitable for producing blue light because their bandgaps are approximately 2.26 eV or less, and in the case of silicon, are indirect semiconductors and inefficient light emitters.

As known to those familiar with LEDs and electronic transitions, a direct transition occurs in a semiconductor when the valence band maxima and the conduction band minima have the same momentum state. This means that crystal momentum is readily conserved during recombination of electrons and holes so that the energy produced by the transition can go predominantly and efficiently into the photon, (i.e., to produce light rather than heat). When the conduction band minimum and valence band maximum do not have the same momentum state, a phonon (i.e., a quantum of vibrational energy) is required to conserve crystal momentum and the transition is called "indirect." The necessity of a third particle, the phonon, makes indirect radiative transitions less likely, thereby reducing the light emitting efficiency of the device.

Generally speaking, an LED formed in a direct bandgap material will perform more efficiently than one formed in an indirect bandgap material. Therefore, the direct transition characteristics of Group III nitrides offer the potential for brighter and more efficient emissions—and thus brighter and more efficient LEDs—than do the emissions from indirect materials such as silicon carbide. Accordingly, much interest in the last decade has also focused on producing light emitting diodes in gallium nitride and related Group III nitrides.

Although Group III nitrides offer a direct transition over a wide bandgap energy range, the material presents a particular set of technical manufacturing problems. In particular, no commercially-viable technique has yet emerged for producing bulk single crystals of gallium nitride (GaN) that are capable of functioning as appropriate substrates for the gallium nitride epitaxial layers on which photonic devices would be formed.

All semiconductor devices require some kind of structural substrate. Typically, a substrate formed of the same material as the active region offers significant advantages, particularly in crystal growth and lattice matching. Because gallium nitride has yet to be formed in such bulk crystals, gallium nitride photonic devices must be formed in epitaxial layers on non-GaN substrates.

Recent work in the field of Group III nitride substrates includes copending and commonly assigned U.S. Pat. No. 6,296,956, issued Oct. 2, 2001 for "Growth of Bulk Single Crystals of Aluminum Nitride;" U.S. Pat. No. 6,066,205 issued May 23, 2000 for "Growth of Bulk Single Crystals of Aluminum Nitride from a Melt;" U.S. Pat. No. 6,045,612 issued Apr. 4, 2000 for "Growth of Bulk Single Crystals of Aluminum Nitride;" and U.S. Pat. No. 6,086,072 issued Jul. 11, 2000 for "Growth of Bulk Single Crystals of Aluminum Nitride: Silicon Carbide Alloys."

Using different substrates, however, causes an additional set of problems, mostly in the area of crystal lattice matching. In nearly all cases, different materials have different crystal lattice parameters. As a result, when a gallium nitride epitaxial layer is grown on a different substrate, some crystal lattice mismatching and thermal expansion coefficient mismatching will occur. The resulting epitaxial layer is referred to as being "strained" by this mismatch. Crystal lattice mismatches, and the strain they produce, introduce the potential for crystal defects. This, in turn, affects the electronic characteristics of the crystals and the junctions, and thus tends to degrade the performance of the photonic device. These kinds of defects are even more problematic in high power structures.

In early Group III nitride LEDs, the most common substrate for gallium nitride devices was sapphire (i.e., aluminum oxide $Al_2O_3$). Certain contemporary Group III nitride devices continue to use it.

Sapphire is optically transparent in the visible and ultraviolet ranges, but has a crystal lattice mismatch with gallium nitride of about 16 percent. Furthermore, sapphire is insulating rather than conductive, and is unsuitable for conductivity doping. Consequently, the electric current that must be passed through an LED to generate the light emission cannot be directed through a sapphire substrate. Thus, other types of connections to the LED must be made.

In general, LEDs with vertical geometry use conductive substrates so that ohmic contacts can be placed at opposite ends of the device. Such vertical LEDs are preferred for a number of reasons, including their easier manufacture and more simple incorporation into end-use devices than non-vertical devices. In the absence of a conductive substrate, however, vertical devices cannot be formed.

In contrast with sapphire, Gallium nitride only has a lattice mismatch of about 2.4 percent with aluminum nitride (AlN) and mismatch of about 3.5 percent with silicon carbide. Silicon carbide has a somewhat lesser mismatch of only about 1 percent with aluminum nitride.

Accordingly, the assignee of the present invention has developed the use of silicon carbide substrates for gallium nitride and other Group III devices as a means of solving the conductivity problems of sapphire as a substrate. Because silicon carbide can be doped conductively, vertical LEDs can be formed. As noted, a vertical structure facilitates both the manufacture of LEDs and their incorporation into circuits and end-use devices.

As known to those familiar with Group III nitrides, their properties differ based on the identity and mole fraction of the present Group III elements (e.g., gallium, aluminum, and indium). Increasing the mole fraction of aluminum tends to increase the bandgap, while decreasing the amount of aluminum tends to increase the refractive index. Similarly, a larger proportion of indium will decrease the bandgap of the material, thus permitting the bandgap to be adjusted or "tuned" to produce photons of desired frequencies. This, however, tends to reduce the chemical and physical stability of the crystal. Other effects based on mole fraction include changes in crystal lattice spacing resulting in strain effects.

As further known to those familiar with light emitting diodes, appropriate ohmic contacts are required to both the p and n portions of the device. In turn, the theoretical and practical quality of an ohmic contact partly depends on the particular semiconductor, the particular metal, and the manner in which the contact is fabricated. Accordingly, the task of providing ohmic contacts to Group III nitride photonic devices has been, and continues to be, an area of specific interest and need. Exemplary, but neither comprehensive nor limiting, discussions are set forth in, for example, J. Chan et al., Metallization of GaN Thin Films Prepared by Ion Beam Assisted Molecular Beam Epitaxy, 339 Mat. Res. Soc. Proc. p.223 (1994); M. Lin et al., Low Resistance Ohmic Contacts on Wide Band-Gap GaN, Appl. Phys. Lett. 64(8), 21 Feb. 1994; and J. Foresi and T. Moustakas, Metal Contacts to Gallium Nitride, Appl. Phys. Lett. 62(22), 31 May 1993. Recent U.S. Patents on the subject include U.S. Pat. Nos. 6,121,127, 6,046,464 and 5,670,798. Again, these are exemplary of the interest in the field rather than a comprehensive or limiting collection of the relevant art.

In particular, better ohmic contacts to p-type Group III nitrides would desirably have less contact resistivity. Additionally, a desired ohmic contact to p-type nitrides would increase the injection efficiency of holes. In particular the generally wide bandgap of AlGaN tends to produce relatively poor ohmic contacts to p-type material.

Accordingly, a need and interest still exist for devices that incorporate vertical geometry, that take advantage of the characteristics that result when the proportions of indium, aluminum, and gallium are desirably adjusted in the active layers, cladding layers, and buffer layers of Group III nitride photonic devices, and that incorporate ohmic contacts that enhance the performance of the devices.

OBJECT AND SUMMARY OF THE INVENTION

Embodiments of the invention includes superlattice contact structure for light emitting devices that includes a plurality of contiguous p-type Group III nitride layers. Other embodiments of the invention provide a contact structure formed of p-type indium nitride, aluminum indium nitride, or indium gallium nitride. In yet another aspect, the invention is a light emitting device that incorporates such contact structures.

The foregoing, as well as other objectives and advantages of the invention and the manner in which the same are accomplished, is further specified within the following detailed description and its accompanying drawings.

BRIEF DESCRIPTION OF THE DRAWINGS

FIG. 3 is a cross-sectional schematic view of the contact structure.

DETAILED DESCRIPTION

The present invention is a p-type Group III nitride contact structure that is useful in light emitting devices capable of emitting in the red to ultraviolet portion of the electromagnetic spectrum.

Figure 1:
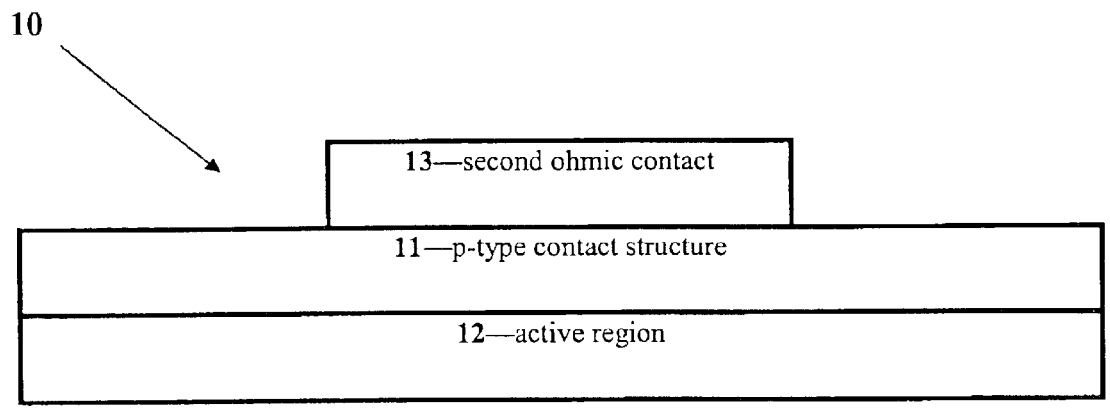
FIG. 1 is a cross-sectional schematic view of the contact structure incorporated into a light emitting device structure.
Figure 2:
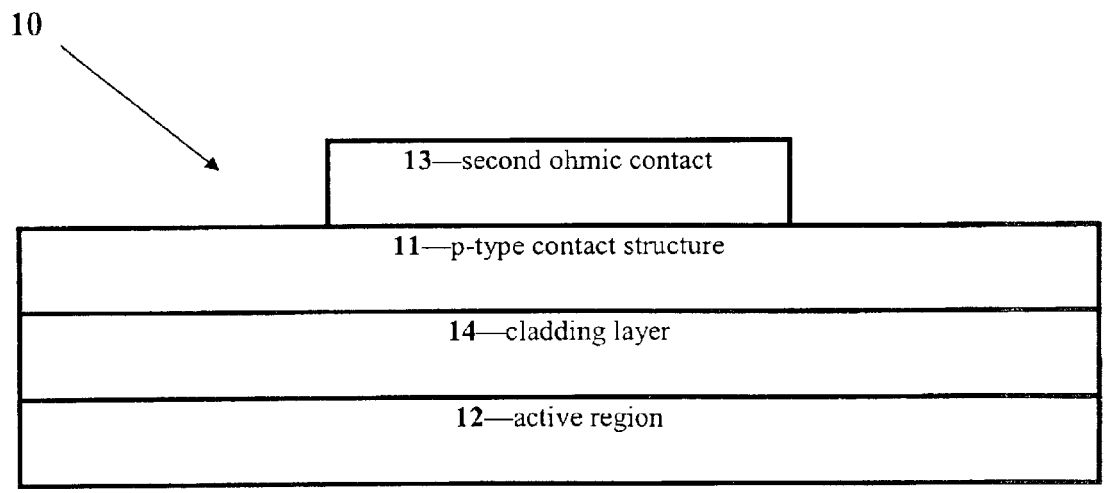
FIG. 2 is a cross-sectional schematic view of the contact structure incorporated into a light emitting device structure.
Figure 4:
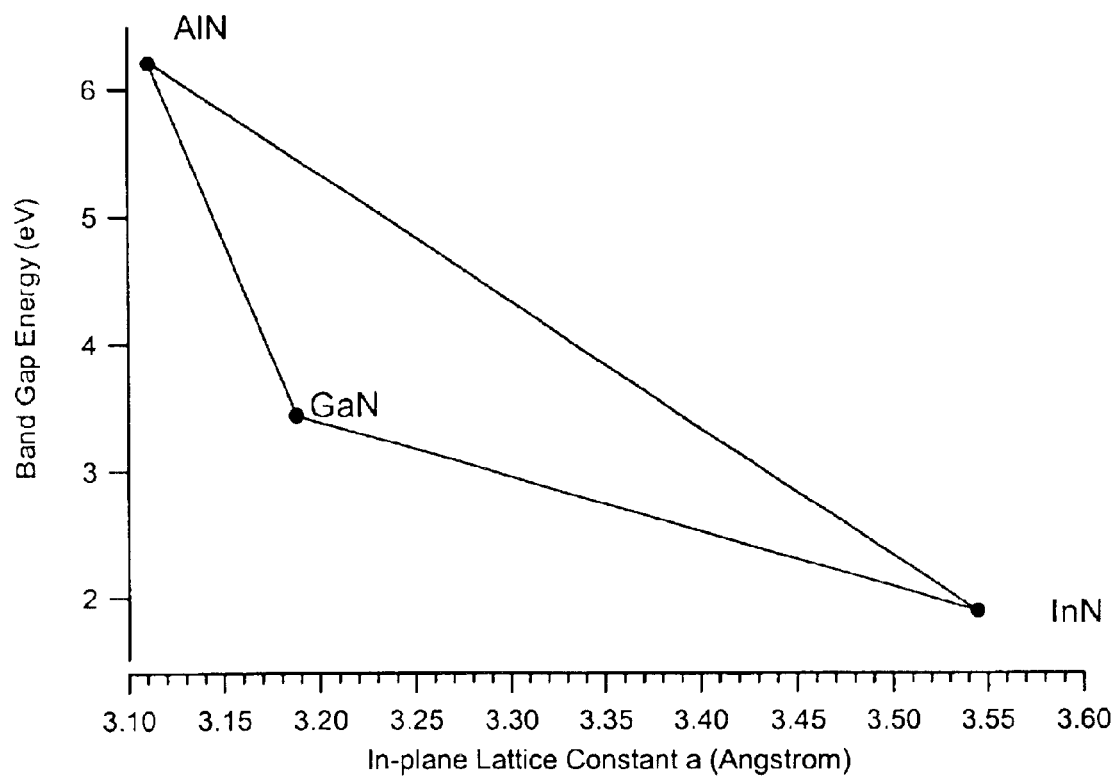
FIG. 4 is a theoretical plot of bandgap energy versus lattice parameter for Group III nitrides alloys of aluminum, indium, and gallium.

An understanding of the invention may be achieved with reference to FIGS. 1 and 2, each of which is a cross-sectional schematic view of an LED embodiment according to the present invention. The LED structure, which is generally designated at 10, includes a p-type contact structure 11 that is positioned between an active region 12 and an ohmic contact 13. See FIG. 1.

In another embodiment, the LED structure 10 further includes a cladding layer 14, which is positioned between the active region 12 and the p-type contact structure 11. See FIG. 2. Accordingly, in this embodiment, the p-type contact structure 11 is positioned between cladding layer 14 (as well as active region 12) and an ohmic contact 13.

It will be appreciated by those of ordinary skill in the art that, as used herein, the concept of one layer being "between" two other layers does not necessarily imply that the three layers are contiguous (i.e., in intimate contact). Rather, as used herein, the concept of one layer being between two other layers is meant to describe the relative positions of the layers within the LED structure. Furthermore, as used herein, the term "layer" generally refers to a single crystal epitaxial layer.

The p-type contact structures 11 for light emitting devices are preferably a superlattice as herein disclosed. In particular, the superlattice contact structure includes a plurality of contiguous p-type Group III nitride layers 15a,b. In this regard, FIG. 3 depicts a p-type contact structure 11 having several contiguous p-type Group III nitride layers 15.

Appropriate superlattice structures are described in copending and commonly assigned U.S. Provisional Patent Application Ser. No. 60/294,308 ("Light Emitting Diode Structure with Superlattice Structure") and U.S. Provisional Patent Application Serial No. 60/294,378 ("Light Emitting Diode Structure with Multi-Quantum Well and Superlattice Structure") which are incorporated herein by reference.

Preferably, the p-type Group III nitride layers are selected from the group consisting of gallium nitride (preferably magnesium-doped gallium nitride); indium nitride; aluminum indium nitride of the formula $Al_xIn_{1-x}N$, where $0<x<1$; indium gallium nitride of the formula $In_xGa_{1-x}N$, where $0<x<1$; and aluminum indium gallium nitride of the formula $Al_xIn_yGa_{1-x-y}N$, where $0<x<1$ and $0<y<1$ and $(x+y)<1$. Within the superlattice structure, at least two of the Group III nitride layers should differ in composition (e.g., a gallium nitride layer and indium nitride layer, or alternatively, two indium gallium nitride layers having different indium and gallium fractions).

A superlattice formed from a plurality of contiguous p-type Group III nitride layers of gallium nitride, aluminum indium nitride, and/or indium gallium nitride is especially desirable, provided at least one contiguous p-type Group III nitride layer is either aluminum indium nitride or indium gallium nitride.

More preferably, the superlattice is formed from at least two alternating layers of p-type Group III nitrides. The alternating layers, which differ in composition from one another, are selected from the group consisting of gallium nitride, indium nitride, aluminum indium nitride of the formula $Al_xIn_{1-x}N$, where $0<x<1$; indium gallium nitride of the formula $In_xGa_{1-x}N$, where $0<x<1$; and aluminum indium gallium nitride of the formula $Al_xIn_yGa_{1-x-y}N$, where $0<x<1$ and $0<y<1$ and $(x+y)<1$. Most preferably, the superlattice is formed from at least two alternating layers of p-type Group III nitrides selected from the group consisting of gallium nitride, aluminum indium nitride of the formula $Al_xIn_{1-x}N$, where $0<x<1$, and indium gallium nitride $In_xGa_{1-x}N$, where $0<x<1$ (i.e., GaN—AlInN, GaN—InGaN, or AlInN—InGaN).

Finally, p-type contact structures 11 for light emitting devices can be a single p-type Group III nitride layer of indium nitride; aluminum indium nitride of the formula $Al_xIn_{1-x}N$, where $0<x<1$; indium gallium nitride of the formula $In_xGa_{1-x}N$, where $0<x<1$; or aluminum indium gallium nitride of the formula $Al_xIn_yGa_{1-x-y}N$, where $0<x<1$ and $0<y<1$ and $(x+y)<1$.

Any of the foregoing p-type contact structures can be incorporated into the LED structures of FIGS. 1 and 2.

As will be understood by those of skill in the art, the exclusion of both 0 and 1 from a formula range requires the presence of both Group III elements in the alloy. Moreover, the recited variables (e.g., x and y) generically refer to the structural layer they describe. That is, the value of a variable with respect to one layer is immaterial to the value of the variable with respect to another layer. For example, in describing the superlattice contact structure, the variable x may have one value with respect to one layer, another value with respect to second layer, and yet another value with respect to a third layer. As will also be understood by those of ordinary skill in the art, the limitation $0 \leq (x+y) \leq 1$ in the expression $Al_xIn_yGa_{1-x-y}N$ simply requires that the Group III elements and the nitride be present in a 1:1 molar ratio.

As is known to those familiar with Group III nitride properties, a particular conductivity type (i.e., n-type or p-type) may be inherent, but is more commonly a result of specifically doping the Group III nitrides using the appropriate donor or acceptor atoms. In this regard, because undoped Group III nitrides will generally be intrinsically n-type, p-type dopants must be included to achieve a p-type contact structure. In particular, in the superlattice of the present invention, the contiguous p-type Group III nitride layers preferably include dopants having low activation energies. This not only increases the conductivity of the superlattice contact structure, but also increases the injection efficiency of holes within each such Group III nitride layer.

The Group III mole fractions can be selected to provide the superlattice contact structure with particular characteristics. For example, FIG. 2 theoretically describes bandgap energy versus lattice parameter. The triangular region of FIG. 2 represents the range of bandgap energies available for Group III nitrides of aluminum, indium, and gallium. FIG. 2 reveals that for any particular lattice parameter, eliminating gallium maximizes the bandgap energy (i.e., the bandgap for an aluminum indium nitride is defined by the AlN—InN segment).

As well understood in this art and as set forth earlier herein, the various properties of the Group III nitride layers (e.g. lattice parameters, refractive index, bandgap, and chemical stability) depend upon the respective mole fraction of the Group III elements present.

In the drawings and the specification, typical embodiments of the invention have been disclosed. Specific terms have been used only in a generic and descriptive sense, and not for purposes of limitation. The scope of the invention is set forth in the following claims.

That which is claimed is:

1. A superlattice contact structure for light emitting devices, comprising at least three contiguous p-type Group III nitride layers selected from the group consisting of gallium nitride, indium nitride, $Al_xIn_{1-x}N$, where $0<x<1$, and $In_xGa_{1-x}N$, where $0<x<1$, wherein at least three contiguous p-type Group III nitride layers in the superlattice contact structure differ in composition, at least one of said p-type layers comprises $Al_xIn_{1-x}N$, where $0<x<1$, each layer is p-type doped, and said contact structure is directly adjacent an ohmic contact.

2. A superlattice contact structure according to claim 1, wherein said contiguous p-type Group III nitride layers include dopants having low activation energies to thereby increase the conductivity of the superlattice contact structure.

3. A superlattice contact structure according to claim 1, wherein said contiguous p-type Group III nitride layers include dopants having low activation energies to thereby increase the injection efficiency of holes within each said p-type contiguous Group III nitride layer.

4. A superlattice contact structure according to claim 1, wherein:
at least two of said three contiguous p-type Group III nitride layers of different compositions are selected from the group consisting of gallium nitride, $Al_xIn_{1-x}N$, where $0<x<1$, and $In_xGa_{1-x}N$, where $0<x<1$; and
at least one of said three contiguous p-type Group III nitride layers of different compositions is selected from the group consisting of $Al_xIn_{1-x}N$, where $0<x<1$, and $In_xGa_{1-x}N$, where $0<x<1$.

5. A superlattice contact structure according to claim 1, wherein said superlattice is formed from alternating groups of said three contiguous layers of different compositions.

6. A light emitting device that can emit in the red to ultraviolet portion of the electromagnetic spectrum, said light emitting device comprising the superlattice contact structure according to claim 1.

7. A light emitting device according to claim 6, further comprising an active region and an ohmic contact, said superlattice contact structure being positioned between said active region and said ohmic contact.

8. A light emitting device according to claim 7, further comprising a cladding layer, said cladding layer being positioned between said active region and said superlattice contact structure.

9. A superlattice contact structure for light emitting devices, comprising:
a first p-type Group III nitride contact layer selected from the group consisting of indium nitride, $Al_xIn_{1-x}N$, where $0<x<1$, and $In_xGa_{1-x}N$, where $0<x<1$;
a second p-type Group III nitride contact layer that is adjacent to said first p-type Group III nitride contact layer and that has a composition that is different from said first p-type Group III nitride contact layer, said second p-type Group III nitride contact layer being selected from the group consisting of gallium nitride, indium nitride, $Al_xIn_{1-x}N$, where $0<x<1$, and $In_xGa_{1-x}N$, where $0<x<1$; and
at least one additional p-type Group III nitride layer contiguous to either said first or second p-type Group III contact layer and that has a composition that is different from said first and second p-type Group III nitride contact layers, said additional layer selected from the group consisting of gallium nitride, indium nitride, $Al_xIn_{1-x}N$, where $0<x<1$, and $In_xGa_{1-x}N$, where $0<x<1$;
wherein at least one of said layers in the superlattice contact structure comprises $Al_xIn_{1-x}N$, where $0<x<1$.

10. A superlattice contact structure according to claim 9, wherein:
said first p-type Group III nitride contact layer is selected from the group consisting of $Al_xIn_{1-x}N$, where $0<x<1$, and $In_xGa_{1-x}N$, where $0<x<1$; and
said second p-type Group III nitride contact layer is selected from the group consisting of gallium nitride, $Al_xIn_{1-x}N$, where $0<x<1$, and $In_xGa_{1-x}N$, where $0<x<1$.

11. A light emitting device that can emit in the red to ultraviolet portion of the electromagnetic spectrum, said light emitting device comprising the superlattice contact structure according to claim 9.

12. A light emitting device according to claim 11, further comprising an active region and an ohmic contact, said superlattice contact structure being positioned between said active region and said ohmic contact.

13. A light emitting device according to claim 12, further comprising a cladding layer, said cladding layer being positioned between said active region and said superlattice contact structure.

* * * * *